United States Patent [19]

Treadwell, III

[11] 4,013,997  
[45] Mar. 22, 1977

[54] ERROR DETECTION/CORRECTION SYSTEM

[75] Inventor: Stephen Smith Treadwell, III, Dallas, Tex.

[73] Assignee: Recognition Equipment Incorporated, Dallas, Tex.

[22] Filed: Nov. 17, 1975

[21] Appl. No.: 632,576

[52] U.S. Cl. ................. 340/146.1 AL; 235/61.7 A
[51] Int. Cl.² ..................... G06F 11/12; G06K 5/00
[58] Field of Search ........ 340/146.1 AL, 146.3 ED, 340/146.3 Z; 235/61.11 E, 61.11 F, 61.7 A, 61.7 R, 61.9 R

[56] References Cited

UNITED STATES PATENTS

| | | |
|---|---|---|
| 3,471,830 | 10/1969 | McRaie et al. ........... 340/146.1 AL |
| 3,506,961 | 4/1970 | Abramson et al. ....... 340/146.1 AL |
| 3,703,628 | 11/1972 | Phillipson, Jr. .............. 235/61.9 R |
| 3,753,227 | 8/1973 | Patel ............................ 235/61.7 A |
| 3,780,271 | 12/1973 | Sharkitt et al. .............. 235/61.7 A |
| 3,886,521 | 5/1975 | Dobras ........................ 235/61.11 E |
| 3,925,760 | 12/1975 | Mason et al. ............ 340/146.3 ED |

OTHER PUBLICATIONS

R. T. Chien, Memory Error Control; Boost Computer Memory Reliability, IEEE Spectrum, July 1973, pp. 18–23.

*Primary Examiner*—Charles E. Atkinson
*Attorney, Agent, or Firm*—John E. Vandigriff

[57] ABSTRACT

In the automatic processing of documents having bar encoded printing thereon, selectively variable error detection and correction codes are added to a bar encoded data field. Read errors which may occur from the reading of document data fields having overprints of inks of various types, colors and densities thereby may be substantially reduced. More particularly, either, neither or both a random parity code and a Bose-Chaudhuri-Hocquenghem (BCH) code may be added to a data message for a bar code printing to accommodate error correction and detection systems having differing processing capabilities. Further, the BCH code may be dynamically and selectively altered to accommodate both documents and data fields of varying lengths.

7 Claims, 11 Drawing Figures

ERROR DETECTION/CORRECTION SYSTEM

This invention relates to bar code encoding of data on documents such as bank checks and the like, and more particularly to a system in which error detection and correction is provided with dynamic selectively adjustable capability.

Normally, data is encoded on the face of bank checks in alphanumeric form in several fields. Such fields are read automatically as by magnetic ink character recognition systems or by optical character recognition systems or by combinations of the same. Once data is captured from the document, it is then frequently converted to a bar code format and reapplied as bar codes at a suitable location on the front or back of the document as described in Philipson U.S. Pat. No. 3,703,628. Such reencoding permits subsequent handling of the same document by less sophisticated reading systems while still providing highly accurate readability.

Uncontrolled printing occurs on bank checks creating readability problems with the bar code printed data. More particularly, checks pass various stamping and cancellation units. Various types, colors and densities of inks are applied to the document. It may be stamped with an ink which coacts with the ink used in the bar codes so that the readability of the bar codes for one or more bars is highly degraded. The documents alternatively may be stamped after the application of the bar codes so that a field of ink unrelated to the bar code data overlays the bar code field rendering interpretation of the bar code printing difficult. For this reason it has been found desirable to incorporate error detection and correction codes along with the data captured from the document to enhance the performance of the processing system and minimize rejects.

Some encoding procedures more than others are capable of accommodating detection of errors and providing for error correction upon the subsequent reading of bar encoded data.

Further, bank checks are processed intermingled as to length. Conventionally, documents may be 6, 7 or 8 inches in length. Check size limits the number of bits that can be encoded in the bar format. In order to maximize the error correction and detection capability, the length of each document may be measured in transit to provide for dynamic change in the error detection and correction capability. For example, with an 8 inch document because there is greater space in which to provide coded data in bar code form, the system can be utilized to detect and correct a greater number of errors than on a 6 inch document.

The use of BCH (Bose-Chaudhuri-Hocquenghem) codes has been found useful in detecting and correcting errors in binary data transmission operations. Representative systems are described in U.S. Pat. Nos. 3,685,014; 3,771,126 and 3,781,791.

It has been found that different sets of data may be optimally processed in systems having different error detection and correction capability. More particularly, BCH encoding involves adding to a message a set of additional unique bits the number of which depends upon the error detection and correction capability required. For example, in a first BCH code (127, 106, 3), the total number of bits is 127 which includes 106 data bits with the capability of detecting 3 errors. A second code is a BCH (127, 99, 4) indicating that an additional 7 bits are required to increase the error detection and correction capability from 3 errors to 4 errors, thus accommodating fewer data bits.

A third code is a BCH (127, 92, 5) indicating that an additional 7 bits are required to increase the capability of detecting and correcting 5 errors rather than 4. In the first code above noted, 21 parity bits are employed; in the second code, 28 parity bits are employed; and in the third code, 35 parity bits are employed. It has been found that several such codes are needed in order to achieve optimum performance on each of the different data fields utilized in one data processing system. Therefore, it is necessary to be able to change from one code to another between documents as well as between fields on a given document, and to provide an indication of the BCH code being used at any one time.

Thus, the present invention is directed to an adjustable system for printing bar encoded data where error detection and correction functions are to be carried out in connection with the subsequent reading of the bar codes.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1

Figure 1:
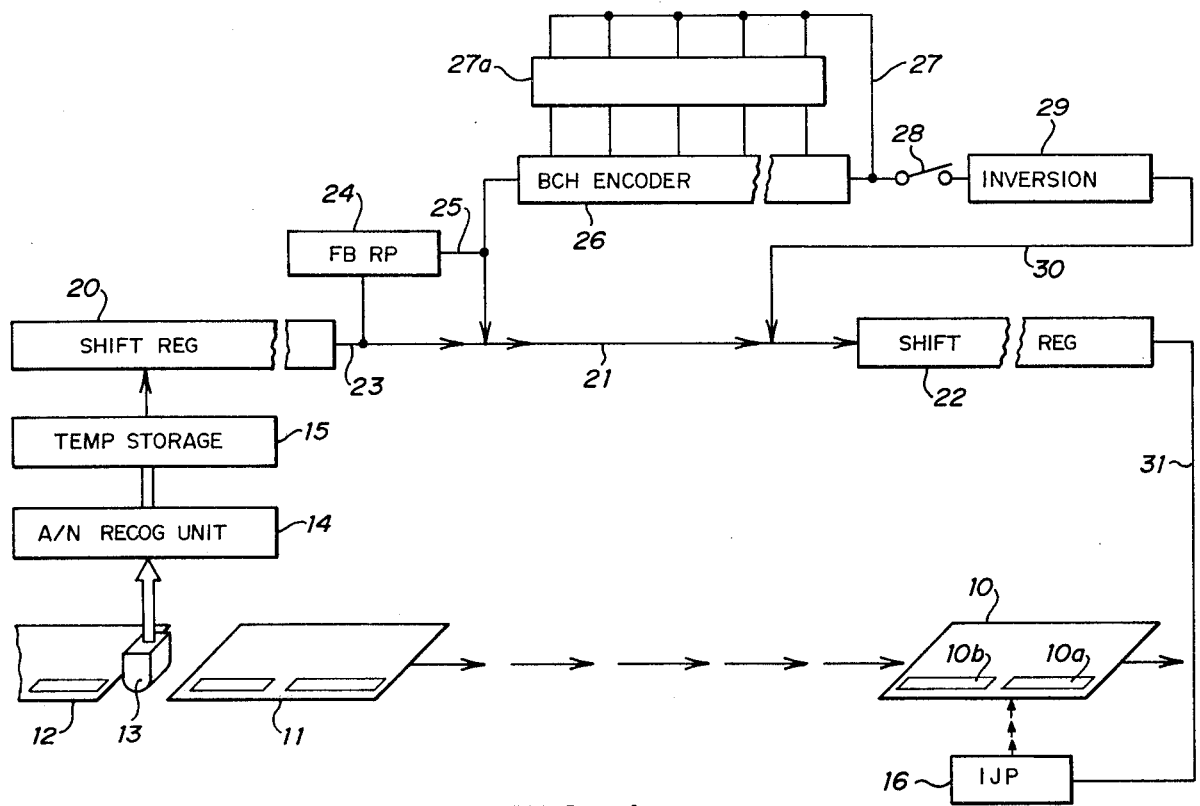
FIG. 1 is a simplified block diagram of a system embodying the invention.

In FIG. 1 a system has been shown in which documents 10, 11 and 12 are part of a stream of documents driven past a reader 13 of alphanumeric reading capability to capture, as a flow of data, information recorded on documents in fields such as fields 10a and 10b. In accordance with such operations which are generally well known and widely used, documents travel at speeds of 200 to 400 inches per second with signals from the reader 13 applied to a recognition unit 14 to convert the alphanumeric data to a serial stream of data bits at a rate dictated by the document speed and spacing. The data stream is then temporarily stored in a memory unit 15. In accordance with prior practices, the output of unit 15 has been employed directly to energize and control an ink jet printer (IJP) 16 which serves to print on the back of document 10 a set of bars representing the data in a bar-no bar sequence to represent binary zeros and ones in a data train.

After printing by the IJP 16, the documents are then employed in subsequent operations. If documents 10, 11 and 12 are typical bank checks, they are sorted, stamped and delivered to specified banks or clearing houses for further processing or collection. In such further operations, bar code readers which are relatively simple compared to the more complex alphanumeric recognition unit 15, may be utilized to read the bar code data thereby simplifying the subsequent handling of the information.

In order to enhance the accuracy of reading the bar code imprinted data, an error detection and correction capability is provided in connection with encoding of the information bar-coded printed on document 10 so that subsequent readers can detect errors in reading from the bar encoded fields.

More particularly in accordance with the present invention, the train of digital data from unit 15 is entered in a shift register 20. The output of shift register 20 is then transferred serially by way of channel 21 to an output shift register 22. When the message comprising a field such as field 10a has been shifted into register 22, register 22 is disabled for a period of time. As the information is being shifted to register 22, it also passes by way of channel 23 through a four bit random parity field generator 24. Data from generator 24 is then applied by way of channel 25 to a BCH encoder 26 as well as to channel 21. Through channel 21 the four bit random parity code is stored in shift register 22 trailing the message 10a. BCH encoder 26 has selectively variable feedback generally represented by a feedback unit 27a connected to output channel 27 for the selective encoding of a set of parity bits that will enable detection of errors in subsequent reading of the bar code field from document 10. The output 27 of encoder 26 is also connected by way of a switch 28 to a bit inversion unit 29 the output of which is applied by way of channel 30 to the input shift register 22.

As the message bits pass from the random parity generator 24 through the encoder 26, switch 28 is effectively kept open. During this time interval, one or more of the channels in unit 27a will be enabled so that a set of bits dependent upon the message and upon feedback that has been provided by way of unit 27a will then be present in the encoder 26. Switch 28 is then effectively closed and the parity bits from the encoder 26 are passed through inversion unit 29 where bits of a selected pattern therein are inverted. The output of inverter 29 is then applied to the shift register 22.

The selected parity inversion is performed to detect errors due to synchronization losses in the reading of the bar encoded data. It is well known that an end-around shift of a BCH encoded message is also a validly encoded BCH message. Thus, if an early or late start occurred in the reading of data printed on a document, there is a high probability that such early or late start would not be detected. However, if selected ones of the BCH bits are inverted before printing, and re-inverted after reading as described in *Error Correcting Codes* by Peterson & Weldon (The MIT Press 1972), pp. 384 to 386, then a synchronization loss will cause the wrong bits to be inverted after the reading. The synchronization loss then may be detected by either attempting to correct a bit known not to be in error, or the data stream may be rejected as having more errors than the BCH code is capable of correcting. Peterson & Weldon describe several different methods of selecting the bits to be inverted. The method used herein involves adding a polynomial $P(x)$ to the BCH encoded message where $P(x)$ is the residue of $x^{l-1}$ modulo $g(x)$. The parameter $l$ is the code length (127 for our application), and the parameter $g(x)$ is the generating polynomial of the code.

The contents of shift register 22 may then be output to appear on channel 31. The output comprises a serial train including the message followed by the random parity code and then followed by the parity bits generated in the encoder 26.

In accordance with one aspect of the present invention, the system is adaptable to varying the mode of operation. More particularly, the system can be set so that the data appearing on channel 31 may be without change the message as applied to shift register 20, i.e., with no additional encoding. In a second setting, it can comprise the message together with the four bit random parity code. In a third setting, it can comprise the message together with the BCH parity bits from encoder 26. In a fourth setting, it may comprise the message plus the four bit parity code trailed by the parity bits from encoder 26. Further in accordance with the invention, dynamic changes may be made in the error detection/correction capability of the data bar encoded on document 10 depending upon the length of the fields available on the document for accommodating the data bits in bar code form and as determined by external constraints.

FIG. 2

Figure 2:
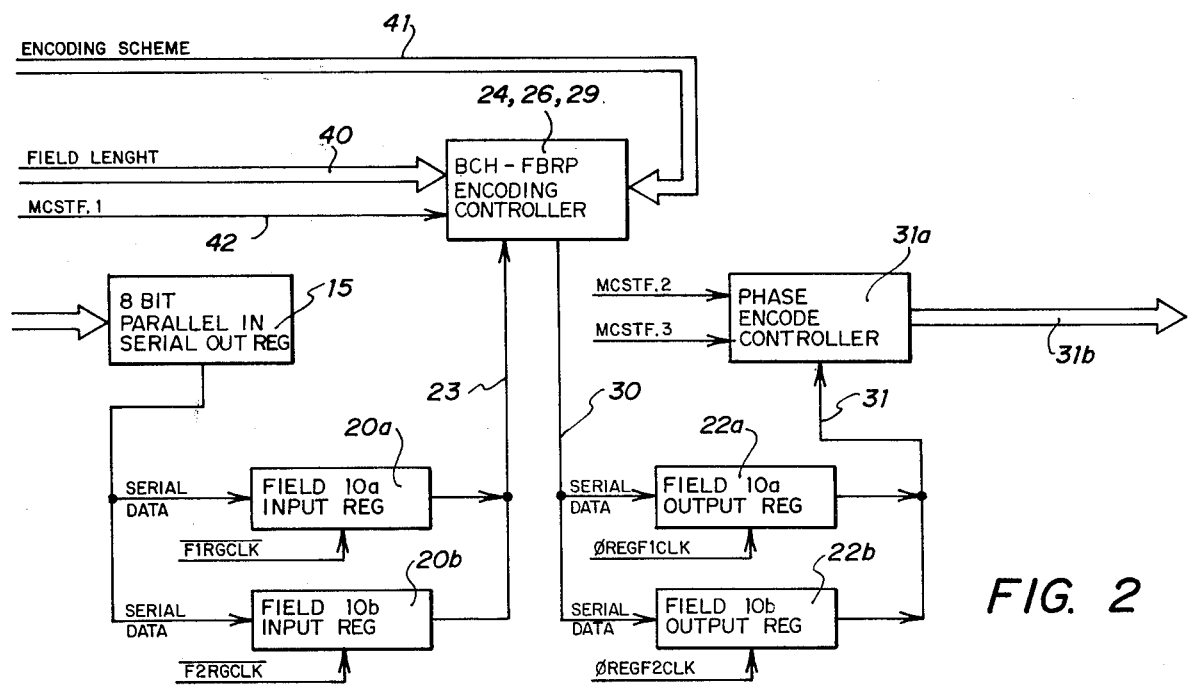
FIG. 2 illustrates the setting for the present invention.

FIG. 2 illustrates the encoder of FIG. 1 in a different setting. The encoder comprises units 24, 26, 29. A temporary storage unit 15 serially outputs the message of field No. 1 (FIG. 1) to an input to register 20a (FIG. 2) and the message of field No. 2 as input to a register 20b. The serial data from registers 20a and 20b then selectively appears on channel 23 leading to the encoding and inversion unit 24, 26, 29. The encoded output appears on channel 30 leading to field No. 1 output register 22a and field No. 2 output register 22b. Outputs from registers 22a and 22b selectively appear on channel 31 for application to a phase encode controller 31a with the output thereof then applied by way of channel 31b to the IJP control unit. Controller 31a and the IJP control unit are well known and are manufactured and sold by the assignee of this application as a part of systems known as The Trace ⁿ System manufactured and sold by the assignee of the present application.

The encoder 24, 26, 29 has a control input by way of channel 40 which signals the field length, i.e., the length of fields 10a and 10b. A second control input is a multi-bit input on channels 41 which signals the encoding scheme. A third control input by way of channel 42 is a master control state which enables unit 24, 26, 29.

FIGS. 3-6 illustrate in detail an embodiment of the encoding system in accordance with FIGS. 1 and 2. Illustrated are details of an embodiment of the system including the four bit random parity encoder 24 shown in FIG. 3, BCH encoder 26 shown in FIG. 4, inversion unit 29 shown in FIG. 5, and a controller for the circuits of FIGS. 3, 4 and 5 detailed in FIG. 6.

FIG. 3

Figure 3:
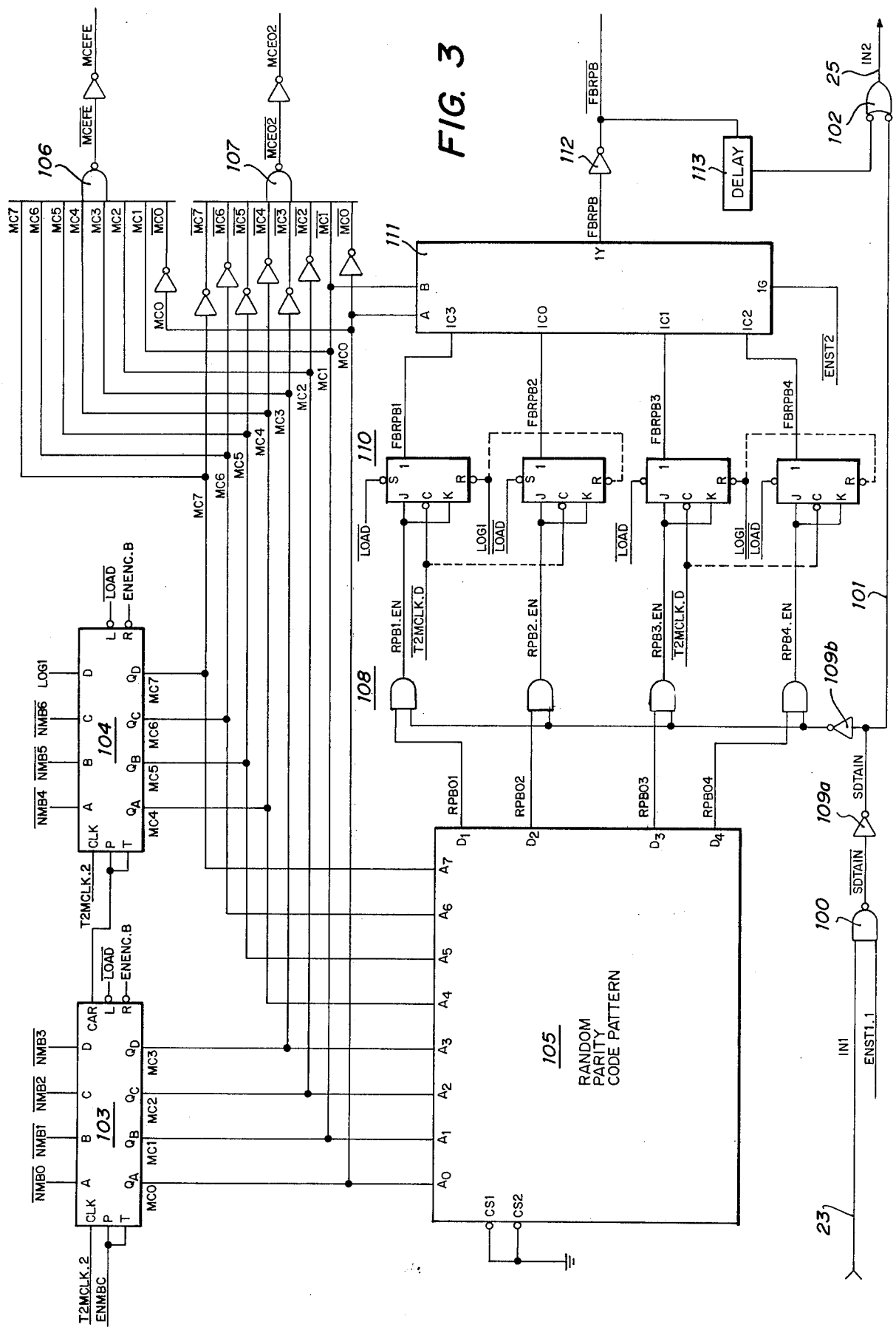
FIG. 3 is a detailed diagram of the four bit random parity generator of FIGS. 1 and 2.

In considering the circuits of FIG. 3, interconnections are indicated by labels in some cases rather than by actual conductors. Therefore, it will be helpful to refer to the following table in which labels on FIGS. 3-6 appear.

TABLE I

| | |
|---|---|
| BCH0...BCH5 | BCH - no correction - 5 corrections |

TABLE I-continued

| | |
|---|---|
| BTCT-255 | Bit counter equal 255 (input shift register) |
| CODE 0 | Type of BCH coding (LSB) |
| ENCOMP | Encoding complete |
| ENENCA | Enable encoder A |
| ENMBC | Enable message bit counter |
| ENPBC | Enable parity bit counter |
| ENSP 10 | Encoder state path 1 to 0 |
| ENSP 123 | Encoder state path 1 or 2 to 3 |
| ENST1,2,3,4 | Encoder states 1, 2, 3 and 4 |
| ENST 3.1 | Encoder state 3 delayed 1 clock |
| FBRP | Four bit random parity |
| FBSR 35 | Feedback shift register (bit 35) |
| IN 1 | Serial data stream - shift register No. 1 |
| LOAD | Load message and parity counters |
| LOG 1 | Tied to high level |
| MCEFE | Message counter equals FE (hex) |
| NMB | Number of message bits |
| NPB 5 | Number of parity bits (MSB) |
| PCEFE | Parity counter equals FE |
| RPB0 | Random parity bit 0 |
| SDTAIN | Serial data in |
| SYS4MCLK | System 4 MHz clock |
| T2MCLK | 2 MHz clock |

In the description of the logic diagrams of FIGS. 3-6, the term NAND gate shall be used to refer to AND gates with inverted outputs or OR gates with inverted inputs. In addition, the term NOR gate shall be used to refer to OR gates with inverted outputs or AND gates with inverted inputs.

Referring now to FIG. 3, channel 23 is illustrated as supplying serial input data to a NAND gate 100 which is enabled by the condition ENST1.1. The output of NAND gate 100 is applied by way of channel 101 to a NAND gate 102 so that the output of the four bit random parity encoder 24 appears on channel 25. The data is fed to unit 24 during system state No. 1 (IN1) and appears on output channel 25 during state No. 2 (IN2).

The four bit random parity encoder comprises message counter modules 103 and 104 connected in series and having output lines MC0-MC7 which lead to the input of a random parity code pattern ROM 105. The outputs of message counter 103, 104 are also supplied to a NAND gate 106 for the generation of a control state MCEFE. They are also applied to a NAND gate 107 to produce an output state MCEO2.

Output channels RPBO1-RPB04 lead from the random parity bit ROM storage unit 105 to a bank of AND gates 108 where the outputs from the ROM 105 and ANDed with the serial data stream from NAND gate 100 which has been inverted in unit 109. The outputs of AND gates 108 are applied to a set of four J-K flip-flops 110 which are initially set to one (1) so that there appears at the input of multiplexer 111 the desired random parity bits. The random parity bits are dictated by sets of binary bits stored in ROM 105. The four random parity bits at the input of multiplexer 111 are then read out by way of inverter 112 and a delay 113 for application to NAND gate 102.

It will be understood that the timing of the system is such that the message in serial data stream form first appears on the channel 25 immediately trailed by the four bits multiplexed by unit 111.

FIG. 4

Figure 4:
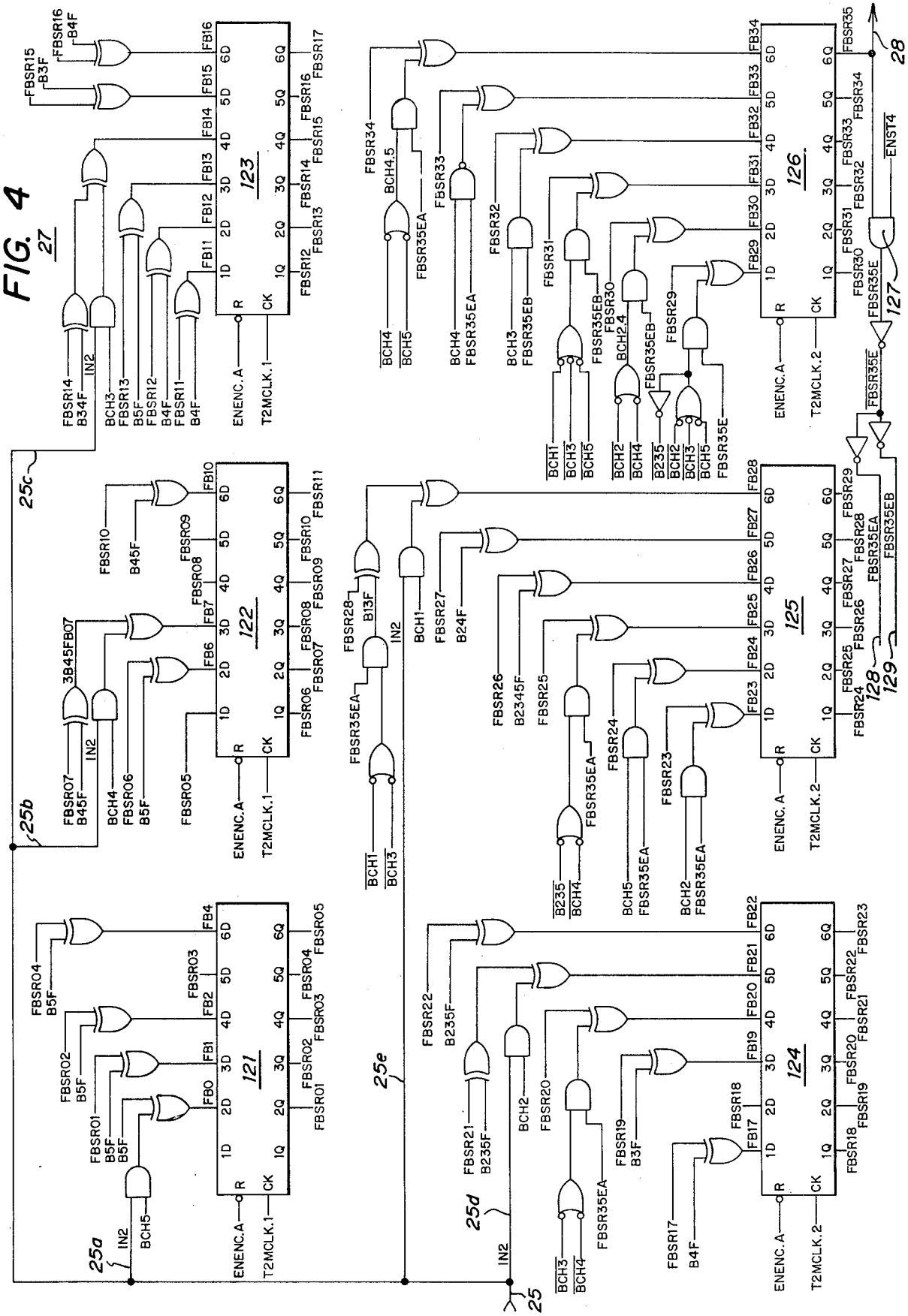
FIG. 4 is a detailed logic diagram of the BCH encoding unit of FIGS. 1 and 2.

Referring now to FIG. 4, the output channel from unit 24, FIG. 3, appears as an input to a 35 bit shift register comprising modules 121-126. Each of modules 121-126 is connected as a six bit shift register. The first bit of register 121 is not used.

Channel 25 is connected by way of lines 25a-25e to each of the shift register modules 121-125. Output line 127 is connected from the last bit of module 126. The feedback path 27 is effectively enabled in state No. 4 by a suitable control voltage ($\overline{ENST4}$) on AND gate 127. The feedback signal FBSR35 is fanned out to appear on channels 128 and 129. The thirty-five outputs of the modules 121-126 (FBSRO1-FBSR35) selectively are fed back to selected inputs in accordance with the legends shown on FIG. 4 for accomplishing the desired BCH encoding of the message bits and the random parity bits.

FIG. 5

Channel 28 leads from the circuit of FIG. 4 to the inversion unit 29. More particularly, channel 28 is connected to an exclusive OR gate 130 the second input of which is supplied by way of channel 131 which operates to invert selected bits in the data stream appearing on channel 28. The output of exclusive OR gate 130 is NANDed with state 4 in unit 132 the output of which is delayed in unit 133 and applied to a NAND gate 134. The second input of NAND gate 134 is supplied from NAND gate 135 one input of which is the complement of state 4 and the second input of which is line 25 from unit 24, FIG. 3.

The inversion unit 29 comprises a pair of counter modules 141 and 142. The outputs of counters 141, 142 are applied by way of channels 143 to read out a selected pattern of bits on lines 144 from a ROM 145. The outputs are then applied to a multiplexer 146 which serve in exclusive OR gate 130 to reverse selected bits in the BCH coded set issuing from BCH encoder 26. The BCH coded parity bits on channel 28, inverted selectively by the output of multiplexer 146, are then applied to NAND gate 134 so that they can be applied to channel 21 for entry into shift register 22, FIG. 1, trailing the message and the four parity bits previously entered therein.

FIG. 6

Figure 5:
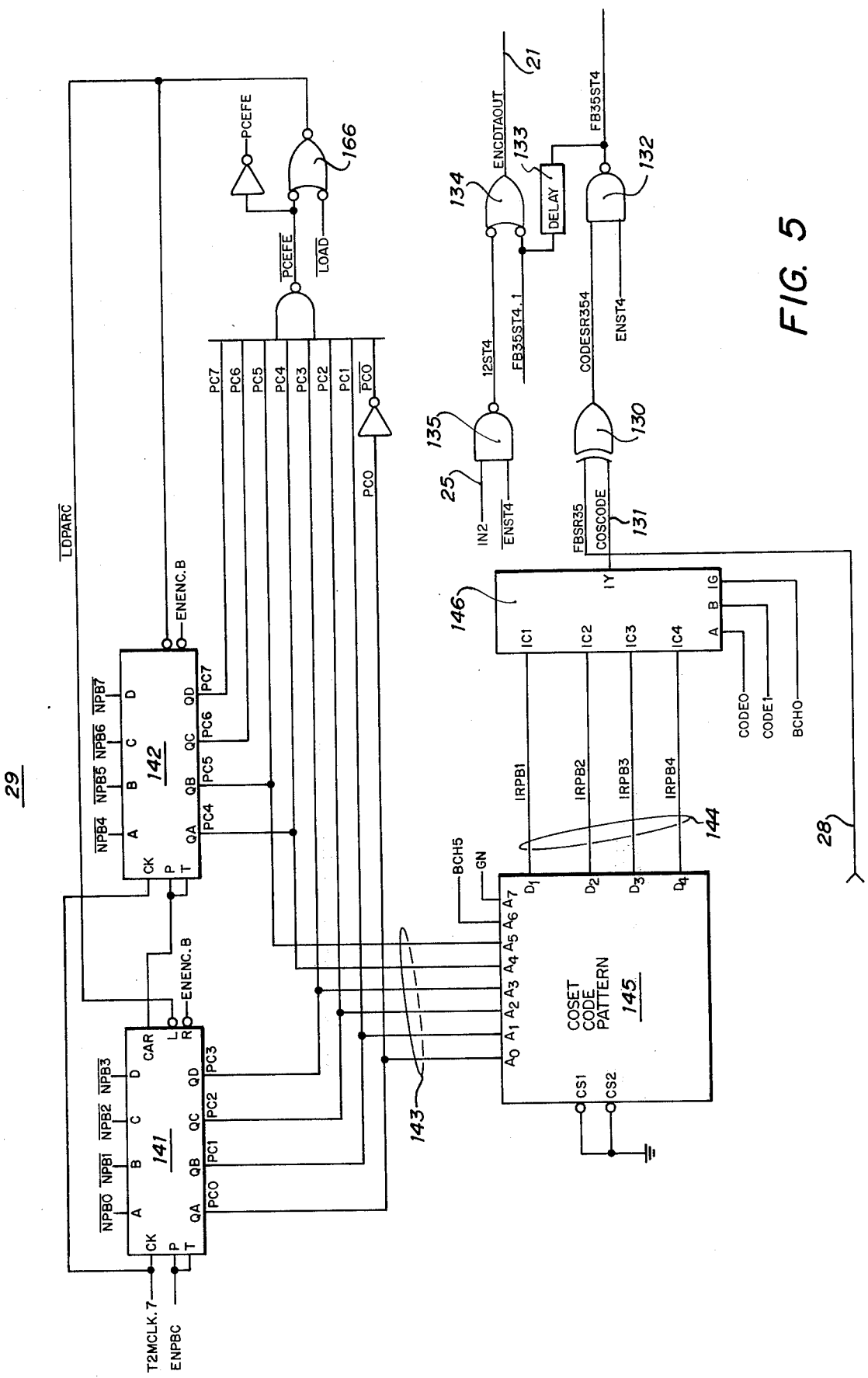
FIG. 5 is a detailed logic diagram of the inversion unit of FIGS. 1 and 2.
Figure 6:
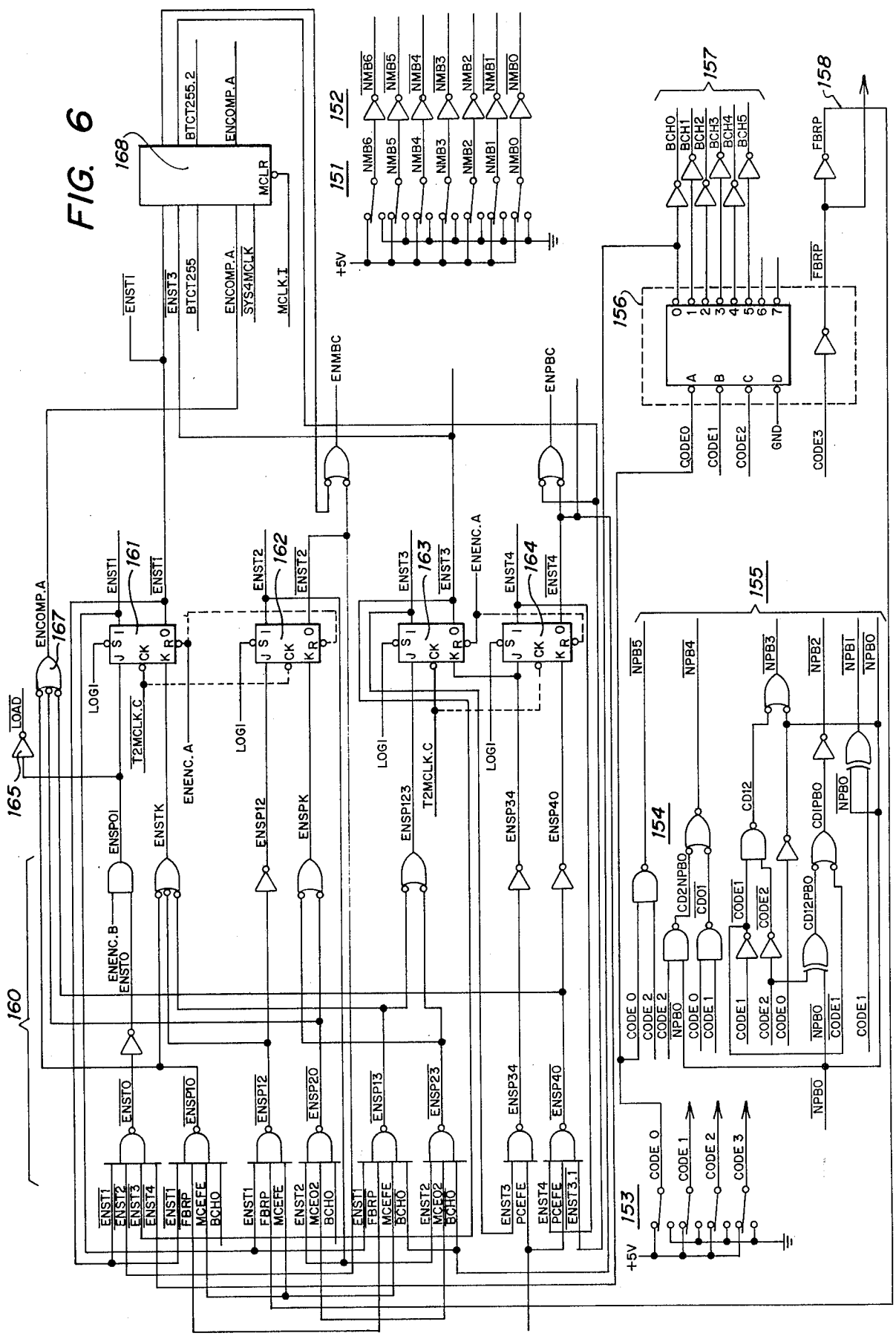
FIG. 6 is a detailed logic diagram of the control logic for the system of FIGS. 3–5.

FIG. 6 illustrates generation of the control voltages for the operation of the circuits of FIGS. 3-5. It will aid in understanding FIG. 6 to refer to the timing chart of FIG. 7.

As in FIGS. 3-6, mneumonics have been extensively employed rather than attempting to actually make physical interconnections with conductors as among the control unit of FIG. 6 and the various elements of FIGS. 3-5.

In initializing the system, there are two sets of conditions that are given with manual input switches 151 provided for inputting those conditions. The first seven switches are to be selectively set to encode the number of message bits contained in the field to be operated upon. Thus, the switches 151 provide a seven bit code causing outputs from inverters 152 to be representative of the bits $\overline{NMB0}$--$\overline{NMB6}$. If the field from document 10 contains 106 data bits, then the switches 151 would be selectively closed to apply the corresponding binary code to the inverters 152.

Similarly, a four bit code is provided by selective closure of switches 153 as an input to unit 154 to generate a six bit output code on channels 155 to indicate the type of correction code to be performed by the system. The outputs on channels 155 represent the complement of the number of BCH bits that are to be loaded in the parity counter comprising counter modules 141 and 142 of FIG. 5.

The outputs of the switches in bank 153 also are applied as inputs to a decoder 156 which provides outputs on channels 157 indicative of the number of corrections that are to be made. For any given operation, one of the output channels 157 will be enabled. The BCH0 channel will be enabled if there are to be no errors corrected. The BCH1 channel will be enabled if only one error is to be corrected. Similarly, channel BCH5 will be enabled if five errors are to be corrected.

Channel 158 will be enabled if the four bit random parity unit 24 is to be employed to implement use of the random parity provisions of the system.

The output channels from inverters 152 are applied as inputs to the message counter modules 103, 104 of FIG. 3. The channels 155 from unit 154 are connected as inputs to the counter modules 141, 142 of FIG. 5. The channels 157 are connected as inputs to various points in the circuit of FIG. 4. Channel 158 is variously connected as an input to logic units 160 which lead to state control flip-flops 161-164. The inverted output from the J input to flip-flop 161, appearing at the output of inverter 165, is a LOAD signal employed to load the message counter modules 103, 104 of FIG. 3, and the BCH parity counter modules 141, 142 of FIG. 5, and more particularly as an input to AND gate 166.

Selected inputs to NAND gate 167, FIG. 6, serves to produce an encoding complete signal which is applied to a multi flip-flop unit 168 to provide output control conditions.

A 4 MHz clock is also supplied unit 168 as the primary clock input. In addition, a 2 MHz clock is provided which also serves as a system clock for timing the operation of the system of FIG. 1.

In the system thus far described, primary components employed were as follows:

| | |
|---|---|
| message counter modules 103, 104, 141, 142 | type 74163, manufactured and sold by Texas Instruments Incorporated of Dallas, Texas. |
| random parity code pattern ROM 105 and selected parity inversion 145 | ROM type 1024, manufactured and sold by Harris Semiconductor of Melbourne, Florida. |
| flip-flops in set 110, 161-164 | J-K flip-flops, type 74H108, manufactured and sold by Texas Instruments Incorporated of Dallas, Texas. |
| multiplexer 111, 146 | type 74153, manufactured and sold by Texas Instruments Incorporated of Dallas, Texas. |
| registers 121-126, FIG. 4 six bit registers | type 74174, manufactured and sold by Texas Instruments Incorporated of Dallas, Texas. |
| decoder 156 | type 4006, manufactured and sold by Motorola Semiconductor Products Incorporated of Phoenix, Arizona. |
| flip-flop array 168 | type 74174, manufactured and sold by Texas Instruments Incorporated of Dallas, Texas. |

FIGS. 7A-7D

Figure 7A:
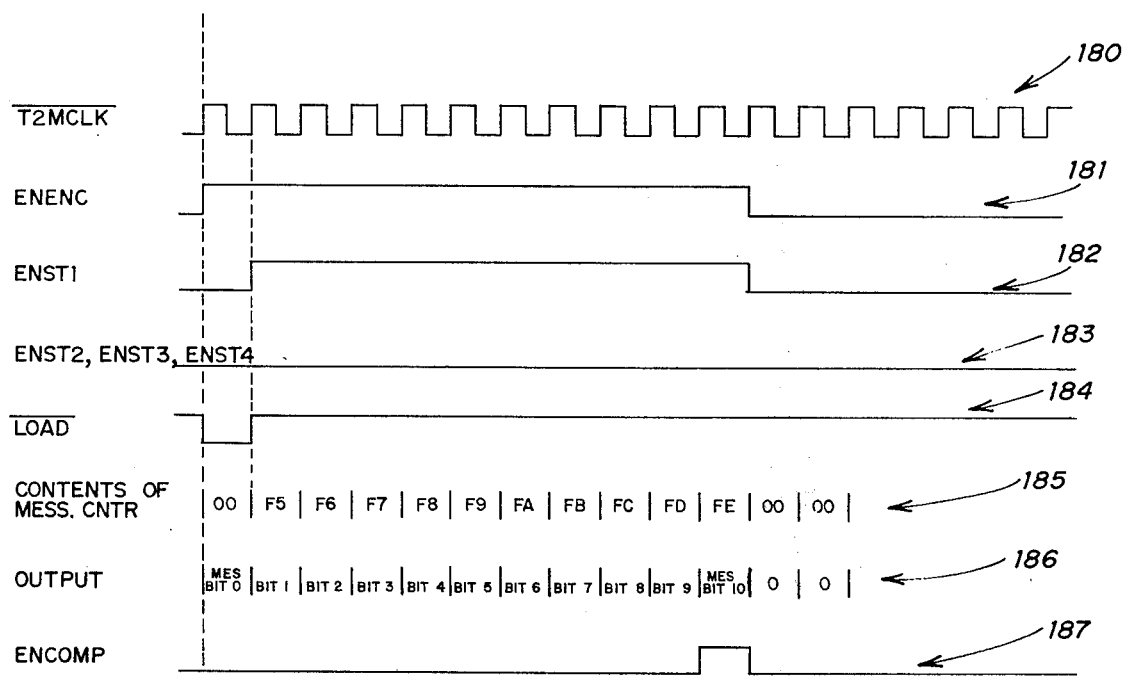
FIG. 7 is a timing diagram appropriate for the system of FIGS. 3–6.

FIG. 7A is a timing diagram of the operation of the encoding system of FIGS. 1-6, wherein no encoding of a message is required.

Waveform 180 illustrates the output of a two megacycle clock from which the operation of the devices comprising the encoding system is synchronized.

A waveform 181 illustrates a signal which is issued by a printer system to indicate that the encoding system has been initialized. More particularly, a message has been shifted into register 20 of FIG. 1, and the register has been right adjusted.

A waveform 182 illustrates the operational period of encoder state 1 during which the information in register 20 is presented to four bit random parity field generator 24, BCH encoder 26 and output shift register 22. Waveform 183 in turn illustrates the quiescent condition of encoder states 2, 3 and 4 during an operation in which no encoding of a message is required.

Waveform 184 illustrates the complement of a load signal which is issued by the printer system to load the message counter modules 103, 104 of FIG. 3 with the complement of the number of message bits previously stored in register 20. In addition, the BCH parity counter modules 141, 142 of FIG. 5 are loaded with the complement of the number parity bits to be generated. The content of the message counter is illustrated by a time-count diagram 185, wherein a count from F5 (representing the complement of the number of message bits) to FE (representing the final message bit) is made during the operational period of waveform 181. The transfer of the message bits to output register 22 is illustrated by a bit timing diagram 186.

Waveform 187 illustrates the occurrence of a pulse to signal the completion of an encoding process. Thereupon, the information in the output register is right justified.

Figure 7B:
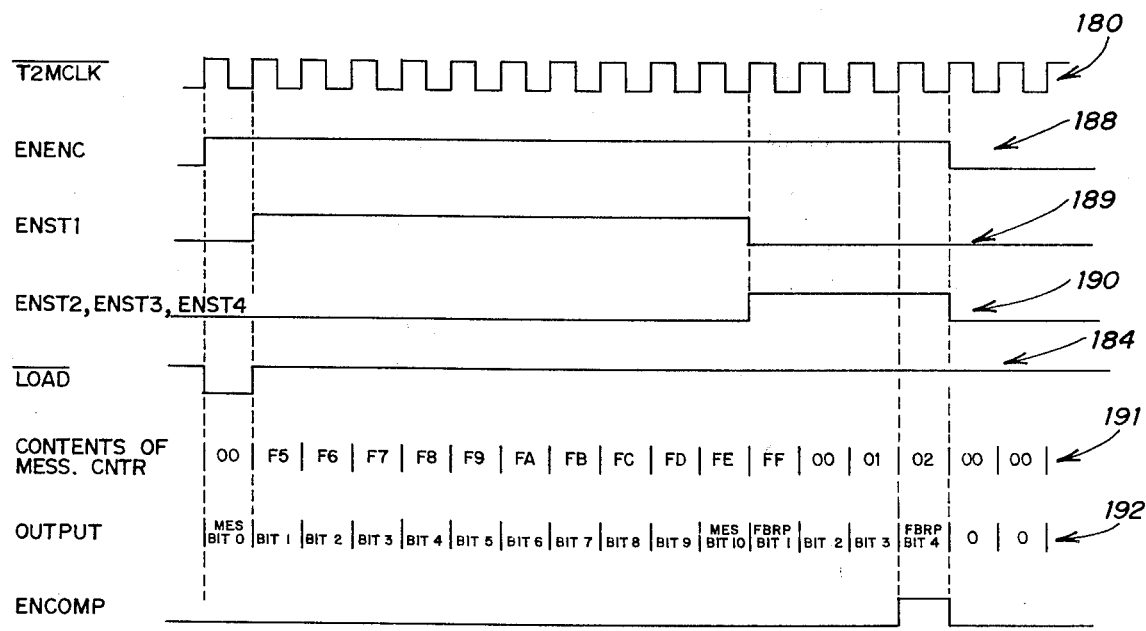

FIG. 7B illustrates the operation of the encoding system of FIGS. 1-6 when only a four bit parity encoding is required. Waveform 188 comprises a pulse, the leading positive going edge of which signals the completion of the process for initializing the encoding system.

Waveform 189 illustrates the operational period of encoder state 1, during which message bits are transferred from shift register 20 to generator 24, BCH encoder 26 and output shift register 22. Waveform 190 illustrates the operational period of encoder state 2 during which the four bit parity generated by generator 24 is transferred to output register 22 and to BCH encoder 26.

The content of the message counter is illustrated by a time-count diagram 191. When the encoded signal including both the message and four bit parity code bits are shifted into output register 22, the message bits are immediately followed by the four parity bits as illustrated by a bit timing diagram 192.

Upon completion of the encoding process, a pulse issues as illustrated by waveform 193.

Figure 7C:
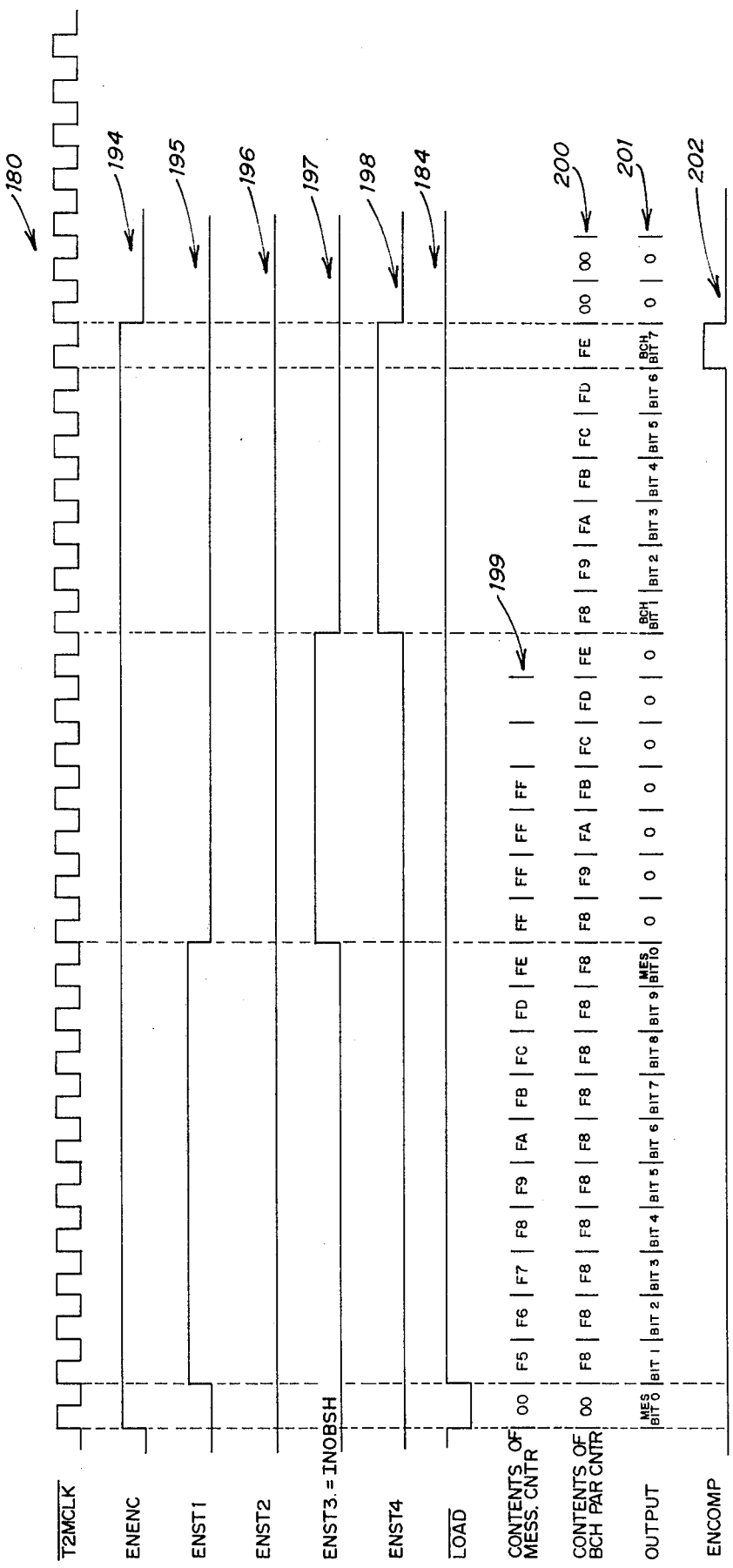

FIG. 7C is a timing diagram illustrating the operation of the encoding system of FIGS. 1-6 where only a BCH encoding is required. The timing diagram is appropriate for the processing of 127 bits including a maximum of 120 data bits, wherein a maximum of seven BCH parity bits are to be generated and only one error is to be detected.

Waveform 194 comprises a single positive going pulse, the leading edge of which signals that the encoding system is ready for operation. Waveform 195 illustrates the operational period of encoder state 1 during which the message bits stored in shift register 20 are presented to parity field generator 24, BCH encoder 26 and shift register 22. Waveform 196 illustrates the quiescent state of encoder state 2 when no four bit parity is required.

Waveform 197 illustrates the operational period of encoder state 3 during which the shift register 22 is inhibited from receiving any further data. The leading edge of the positive going pulse comprising waveform 197 occurs at the same time as the trailing edge of the pulse comprising waveform 195.

Waveform 198 illustrates the operational period of encoder state 4 during which the feedback to the feedback shift register 27a is disabled, and the BCH code formed by encoder 26 is shifted through inversion unit 29 to output shift register 22.

A time-count diagram 199 illustrates the content of the message counter during the encoding operation. As before described, the count F5 is the complement of the number of message bits received by register 20.

A time-count diagram 200 illustrates the content of the BCH parity counter during the encoding operation. The count F8 is the complement of the number 7, which is the number of BCH bits to be generated. As may be seen by inspection of diagram 200, the parity counter counts to FE from F8 during the operational period of encoder state 3, as illustrated by waveform 197. The BCH code, partially formed in encoder state 1, is completed during encoder state 3. The counter then reloads to F8 and again counts to FE during encoder state 4. During state 4, the counter issues seven pulses to shift the BCH code out of encoder 26 and through inversion unit 29 to output register 22. The message bits are immediately followed by the BCH bits in the output register.

A bit timing diagram 201 illustrates the time transfer of message and BCH bits to output register 22. Upon the occurrence of an encoding complete pulse as illustrated by waveform 202, the encoding process is complete.

Figure 7D:
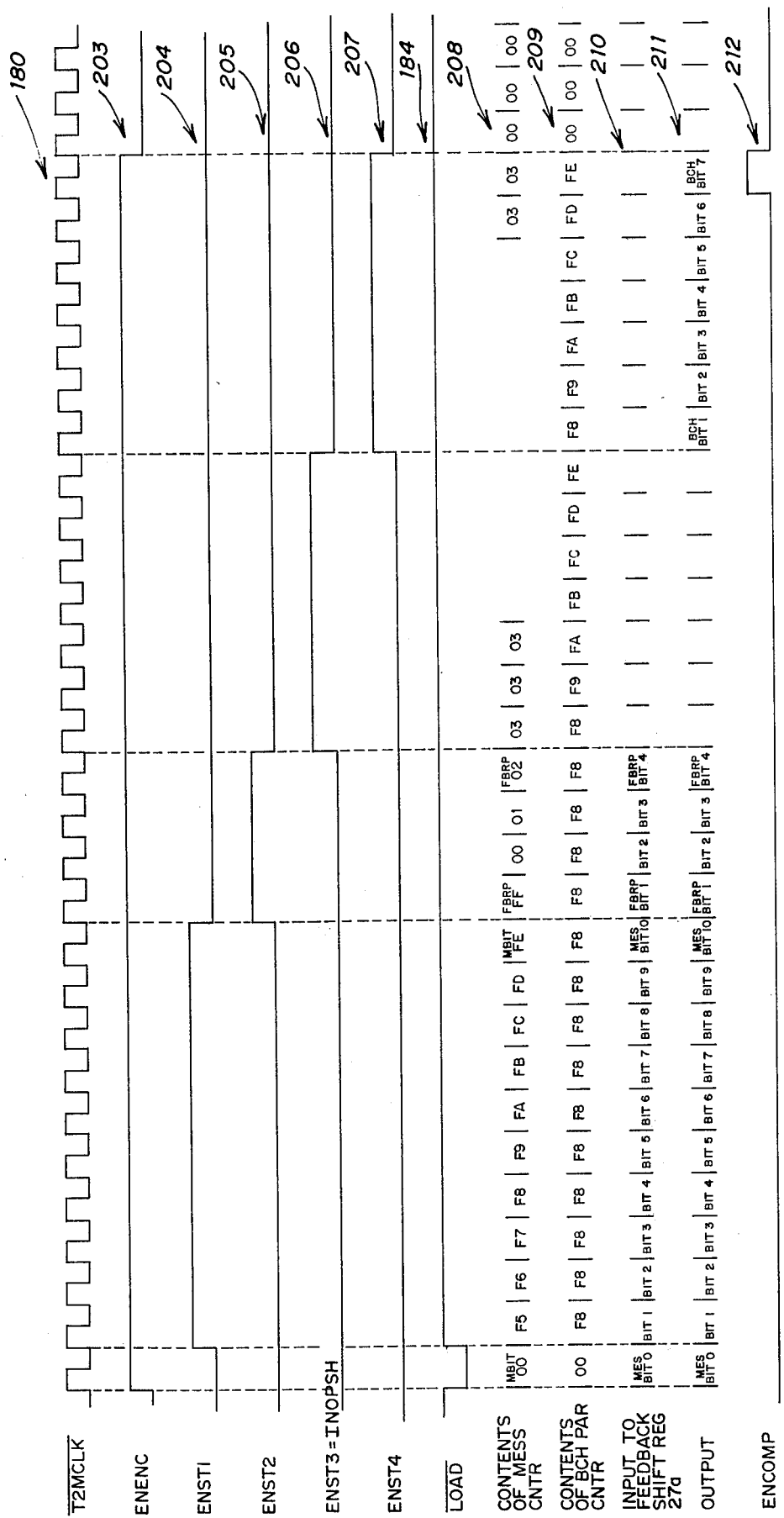

FIG. 7D is an illustration of a timing diagram for the encoding system of FIGS. 1-6 wherein a maximum one hundred sixteen message bits are to be processed, seven BCH bits are to be generated, and one error is to be detected. The timing diagram is appropriate for the processing of 127 bits including a maximum of 116 data bits, wherein a maximum of seven BCH parity bits are to be generated and only one error is to be detected. Both four bit parity and BCH encoding are required.

A waveform 203 is comprised of a positive going pulse, the leading edge of which signals that the encoding system has been initialized for operation. A waveform 204 illustrates the operational period of encoder state 1 as before described, and a waveform 205 illustrates the operational period of encoder state 2. In like manner, waveforms 206 and 207 illustrate the operational periods of encoder states 3 and 4, respectively.

The contents of the message counter during the encoding process are illustrated by a time-count diagram 208, and the contents of the parity counter are illustrated by a time-count diagram 209. As before described, the parity counter counts seven times to initiate shifts in feedback unit 27a during the generation of seven BCH bits, and reloads to count an additional seven times to shift the BCH bits through inversion unit 29 to output shift register 22. The message bits are immediately followed by four random parity bits which in turn are immediately followed by the seven BCH bits.

The information presented to BCH encoder unit 26 during the encoding process is illustrated by a bit timing diagram 210, and the information presented to output register 22 is illustrated by a bit timing diagram 211.

Upon the occurrence of an encoding complete pulse as illustrated by waveform 212, the encoding process is complete.

FIG. 8

Figure 8:
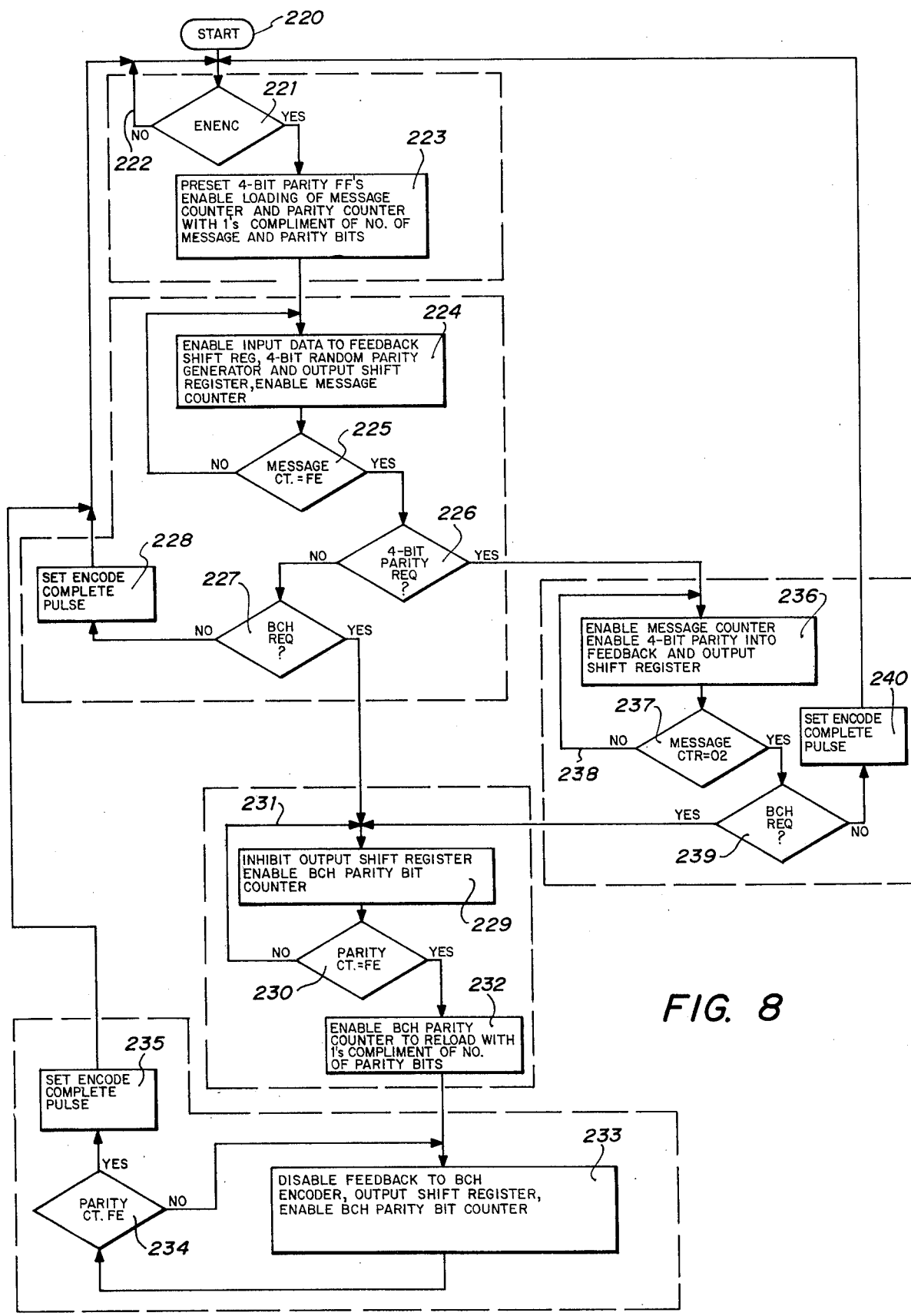
FIG. 8 is a flow diagram illustrating the operation of the systems of FIGS. 3-6.

FIG. 8 is a logic flow diagram illustrating the operation of the system of FIGS. 3–6.

Entry is made at logic step 220 from which a transfer is made to logic step 221 to test for the presence of an encoding command. If an encoding command is not present, the logic decision flow cycles about logic path 222 until an encoding command occurs. Upon the occurrence of an encoding command, a transfer is made from logic step 221 to a logic step 223 where the flip-flops comprising the four bit random parity field generator 24 are preset, a message counter is loaded with the one's complement of the number of message bits received, and a parity counter is loaded with the one's complement of the number of parity bits for a selected BCH code.

A transfer then is made from logic step 223 to a logic step 224 where the message counter is enabled and the message bits resident in shift register 20 are forwarded to generator 24, BCH encoder 26, and output shift register 22. Thereafter, a transfer is made to a logic step 225, where the current count of the message counter is sensed and compared with the value represented by the hexadecimal FE. If the message count is not equal to FE, a transfer is made back to step 224. Upon the occurrence of a message count of FE, however, a transfer is made from step 225 to a logic step 226 to test for the occurrence of a four bit parity command.

If a four bit parity is not required, a transfer is made from step 226 to a logic step 227 to test for the occurrence of a BCH encoding command. If no such command is present, a transfer is made from step 227 to a logic step 228 to signal the completion of the encoding process, and to return to logic 221 where the process continues as before described.

If a BCH encoding command is present at step 227, a transfer is made to a logic step 229 where further inputs to output shift register 22 are inhibited, and the parity counter is enabled to control a bit shift in BCH encoder 26 corresponding to the number of BCH parity bits to be encoded. A transfer then is made from step 229 to a logic step 230 where the current count of the parity counter is sensed and compared to the hexadecimal value FE. If the current count is less than FE, a transfer is made from step 230 along a logic path 231 to step 229. If the current count is equal to FE, however, a transfer is made from step 230 to a logic step 232 where the parity counter is reloaded with the one's complement of the number of parity bits in the selected BCH code.

From step 232, a transfer is made to a logic step 233 where feedback unit 27a is disabled. At this point in the encoding process, the required BCH code has been generated and is available in encoder 26. Output shift register 22 also is enabled for further inputs, and the parity bit counter is enabled to commence counting. Transfer then is made from step 233 to a logic step 234 to compare the current count in the parity bit counter with the hexadecimal FE.

If the current parity count is not equal to FE, a transfer is made from step 234 to step 233 where the process continues as before described. The logic decision flow cycles through steps 233 and 234 to shift a total number of times equal to the number of parity bits in the selected BCH code. As the BCH bits are shifted out of encoder 26, the parity bit counter addresses a ROM (not shown) which in turn directs the bit inversion unit 29 to invert selected ones of the bits. Upon the occurrence of a parity count of FE, a shift is made from step 234 to a logic step 235 to signal the completion of the encoding process, and to reenter at step 221 to commence the processing of a next message.

In the encoding process above described, only a BCH encoding was required. No four bit parity encoding was commanded. In the event that a four bit parity encoding is required, a transfer is made from step 226 to a logic step 236 where the message counter is enabled to commence counting. In addition, both BCH encoder 26 with feedback unit 27a and output shift register 22 are enabled to receive the four bit parity output by four bit random parity field generator 24. Thereafter, a transfer is made from step 236 to a logic step 237 where the current message count is compared to hexadecimal 02, which is four counts greater than the hexadecimal value FE used as a reference value at logic step 225. If the current message count is not equal to hexadecimal 02, the logic decision flow continues to cycle about logic path 238 until a hexadecimal 02 count occurs. Upon the occurrence of such a count, a transfer is made from step 237 to a logic step 239 to test for the presence of a BCH encoding command. If such command is not present, a transfer is made from step 239 to a logic step 240 to signal the completion of the encoding process, and to reenter step 221 to commence the processing of a next message.

If BCH encoding is required, however, a transfer is made from step 239 to logic step 229 where the process continues as before described.

Having described the invention in connection with certain specific embodiments thereof, it is to be understood that further modifications may now suggest themselves to those skilled in the art. For example, the embodiment herein described may be automated by restricting the data field lengths which may occur with particular document lengths. By sensing a document length, therefore, the settings of switches 151 and 153 of FIG. 6 may be automatically provided. It is intended to cover such modifications as fall within the scope of the appended claims.

What is claimed is:

1. In the bar code printing of information on documents subject to uncontrolled printing in the area of a bar encoded data field, the combination which comprises:

a. BCH encoding means for adding a variable BCH code with the length of the code depending on the size of the document to said information to be printed as a bar code on said document; and
   b. means in electrical communication with said BCH encoding means for dynamically and selectively altering said BCH code to accommodate a plurality of information field lengths at least as frequently as the information field rate.

2. A method of encoding binary information to be bar code printed on a document surface whereby bar code readers may detect and correct errors in the reading of bar encoded data fields, which comprises:

a. adding to said binary information depending on the size of said document a plurality of encoded bits, the magnitude of said plurality depending upon the error detection and correction capability required; and
   b. dynamically and selectively altering said plurality of encode bits to accommodate plural variable field lengths of said binary information.

3. The method set forth in claim 2 including the step of inverting selected ones of said plurality of encoded bits to detect read errors caused by a loss of synchronization during the reading of bar encoded data fields.

4. A system for incorporating an error detection and correction capability into a bar encoded data field printed on a document surface, which comprises:

a. BCH parity bit generating means operating upon a message captured from said document surface for adding a plurality of bits dependent upon a selected BCH code and dependent upon the size of the document;
   b. inversion means operating upon the output of said BCH parity bit generating means for inverting selected ones of said plurality of bits in accordance with said selected BCH code; and
   c. means in electrical communication with said BCH parity bit generating means for dynamically and selectivity altering said plurality of bits to accommodate a stream of messages of varying bits field lengths.

5. The combination set forth in claim 4 wherein said system includes a random parity bit generating means upstream to said BCH parity bit generating means and operating upon said message for generating a four bit random parity field to be added to said message.

6. The combination set forth in claim 5 including manually energized switching means for selectively enabling said random parity bit generating means and said BCH parity bit generating means.

7. The combination set forth in claim 4 wherein said BCH parity bit generating means includes a feedback shift register having a plurality of feedbacks.

* * * * *